United States Patent

Blazier et al.

[11] Patent Number: 5,903,440
[45] Date of Patent: May 11, 1999

[54] METHOD OF FORMING ASSEMBLIES OF CIRCUIT BOARDS IN DIFFERENT PLANES

[75] Inventors: Michael Wayne Blazier, Kokomo; Frank Martin Stephan, Galveston, both of Ind.

[73] Assignee: Delco Electronics Corporaiton, Kokomo, Ind.

[21] Appl. No.: 09/016,782

[22] Filed: Jan. 30, 1998

[51] Int. Cl.⁶ .................................................. H05K 7/02
[52] U.S. Cl. .................. 361/749; 361/748; 361/760; 361/751; 361/753; 361/777; 361/776; 361/807; 361/809; 257/690; 257/700; 439/77; 174/254; 174/255
[58] Field of Search ..................................... 361/749, 751, 361/748, 760, 753, 762, 777, 776, 807, 809, 811; 257/690, 700; 439/77; 174/254, 255

[56] References Cited

U.S. PATENT DOCUMENTS

| | | |
|---|---|---|
| 4,781,601 | 11/1988 | Kuhl et al. ............................. 439/77 |
| 4,928,206 | 5/1990 | Porter et al. ............................. 361/699 |
| 5,452,182 | 9/1995 | Eichelberger et al. .................. 361/749 |
| 5,555,159 | 9/1996 | Dore ........................................ 361/796 |

*Primary Examiner*—Leo P. Picard
*Assistant Examiner*—David Foster
*Attorney, Agent, or Firm*—Jimmy L. Funke

[57] ABSTRACT

A method of forming a circuit board with electronic assemblies lying in different planes, includes providing a single circuit board with entire electronic assemblies pressed thereon. A channel is then formed in the circuit board of a predetermined depth to divide the circuit board into two separate, but integral portions. The circuit board is then bent at a point between the first and second portions of the circuit board such that the second portion of the circuit board can be bent between 0 and 180 degrees with respect to the first portion of the circuit board.

12 Claims, 1 Drawing Sheet

METHOD OF FORMING ASSEMBLIES OF CIRCUIT BOARDS IN DIFFERENT PLANES

TECHNICAL FIELD

The present invention relates to the formation of electronic assemblies consisting of multiple circuit boards lying in different planes. More specifically, the present invention relates to a method of bending portions of a single circuit board so that integral portions of a single circuit board lie in different planes.

BACKGROUND ART

Currently, multiple circuit boards are employed during the assembly of various electronic assemblies. Some electronic assemblies utilize multiple circuit boards lying in different planes because it is not possible to house the components on a single circuit board. One example of such an assembly includes a horizontal main circuit board with a separate vertical display/control circuit board for switches and displays such as used in car audio products. Another example of such an assembly includes a horizontal main circuit board with a separate vertical circuit board for housing components attached to a vertical heat sink. Still another example of such an assembly includes a horizontal main circuit board with a separate vertical circuit board for mounting connectors. Many other applications exist that require the use of multiple circuit boards lying in different planes.

In the assemblies that require separate circuit boards lying in different planes, the various boards must be placed in electrical communication in some way. Typically, the horizontal circuit boards and the vertical circuit boards are connected by cables, soldered wires, plugs or other connectors extending between the two boards. The connections between the multiple circuit boards can require the use of many separate wires or connectors. These assemblies are costly and time consuming. Additionally, because of the separate individual connections required at each of the multiple circuit boards, these assemblies are more failure prone than a single circuit board.

SUMMARY OF THE INVENTION

The present invention is directed to overcoming one or more of the problems as set forth above. It is an object of the present invention to provide a circuit board assembly with portions lying in different planes that eliminates the need for separate wires, plugs, or other connectors.

A further object of the present invention is to provide a circuit board assembly that is less expensive and less time consuming to manufacture.

Another object of the present invention is to provide a method of forming a circuit board assembly with a single circuit board with integral portions lying in different planes that is less failure prone than prior assemblies.

According to the present invention, the foregoing and other objects are attained by providing a circuit board assembly, including a single circuit board. The single circuit board has an entire component assembly built thereon. The circuit board has two separate portions, a first portion of which lies in a predetermined plane and the second portion of which is integral with the first portion and lies in a separate plane from said first portion. The angle between the first portion and the second portion can be anywhere from above 0 to less than 180 degrees. A channel is formed in the circuit board between the first portion of the circuit board and the second portion of the circuit board to assist in the bending of the circuit board.

It is an additional object of the present invention to provide a method of forming a circuit board with electronic assemblies lying in different planes for use in vehicle audio products. An entire assembly is built on a single circuit board such that the circuit board has a first portion and a second portion. The circuit board is then heated locally to soften the circuit board at a location between the first portion and the second portion. The circuit board is then bent at the location between the first portion and the second portion such that the second portion of the circuit board is displaced from between 0 and 180 degrees with respect to the first portion of the circuit board.

DETAILED DESCRIPTION OF THE PREFERRED EMBODIMENTS

Figure 1:
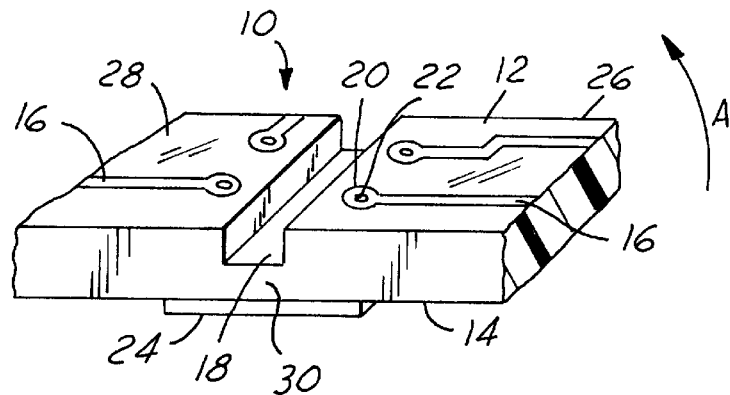
FIG. 1 is a perspective view of a circuit board assembly with a channel formed therein prior to forming in accordance with a preferred embodiment of the present invention.

FIG. 1 illustrates a circuit board 10. The circuit board 10 has an entire component assembly formed in or on one or both of its top surface 12 and its bottom surface 14. The components that comprise the assembly would be well known to those of ordinary skill in art depending upon the application for which the circuit board 10 is being used. However, a plurality of conducting traces 16 are shown formed on the top surface 12 of the circuit board 10. It should be understood that there are many different types of component assemblies that may be utilized. For example, a single-side circuit board with traces on one side only may be used. Additionally, a two-sided circuit board with traces on both sides and through-board connections by holes that are plated through or printed through with conductive material may be utilized. Still further, a multi-layer board with traces on both sides of the board as well as on the layers within the board.

The circuit board 10 shown in FIG. 1 is a circuit board formed by a plated through hole process and has a channel 18 formed therein. The plurality of conducting traces 16 terminate in copper pads 20 with plated holes 22 formed in their center. The traces 16 run under the channel 18, as shown by the connecting lead 24, which is enlarged for purposes of illustration, and connects to the conductors on the other side of the channel 18. A single channel 18 is preferably formed to separate the circuit board 10 into a first section 26 and a second section 28. The channel 18 is preferably formed by routing or sawing, however, it may be formed by any other suitable method. It should also be understood that any number of channels 18 may be formed in a circuit board 10 to separate it into more than two sections. Additionally, a number of channels 18 may be formed in close proximity to one another and still separate the circuit board 10 into two sections. In this embodiment, multiple small channels 18 are formed in the board allowing it to bend in a broad radius.

Figure 2:
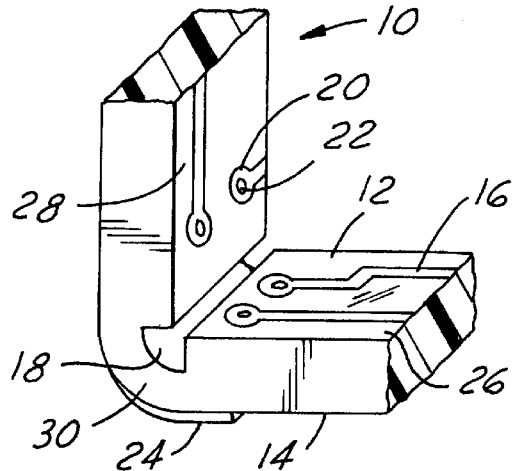
FIG. 2 is a perspective view of the circuit board assembly of FIG. 1 after forming in accordance with a preferred embodiment of the present invention.

In the preferred embodiment, the channel 18 is formed such that only a thin remainder of the supporting layer 30 of the circuit board 10 is left as well as the conducting traces 16. After the channel 18 has been formed in the board 10, either the first section 26 or the second section 28 is bent. The board is preferably bent along the channel 18 so that the first section 26 is perpendicular to the second section 28, i.e, that one of the sections is bent 90 degrees, such as shown in FIG. 2. The bending is schematically illustrated by the arrow A. The allows the circuit board 10 to have both a horizontal main board and a vertical user interface board which are in both physical contact with one another as well as electrical communication.

Figure 3:
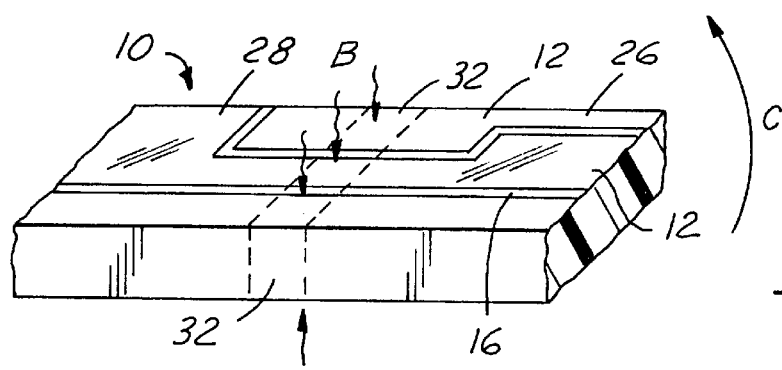
FIG. 3 is a perspective view of a circuit board assembly prior to forming in accordance with another preferred embodiment of the present invention.

Turning now to FIG. 3, another circuit board 10 is illustrated. The circuit board 10 also has an entire component assembly formed in its top surface 12, including a plurality of conducting traces 16. This circuit board is illustrated as a single sided board, however, it may be any type of circuit board, including a plated through hole board or printed through hole board. The components that comprise the assembly would be well known to those of ordinary skill in art depending upon the application for which the circuit board 10 is being used.

Figure 4:
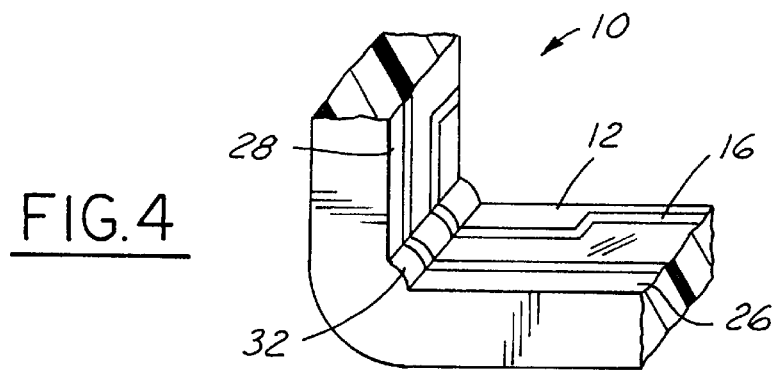
FIG. 4 is a perspective view of the circuit board assembly of FIG. 3 after forming in accordance with another preferred embodiment of the present invention.

The circuit board 10 is subjected to local heating at 32, as shown by the arrows B. The localizing heating is performed at a temperature sufficient to soften the circuit board all the way through. After the circuit board 10 been heated, either the first section 26 or the second section 28 is bent. The board is bent along the area subjected to localized heating 32 and is preferably bent so that the first section 26 is perpendicular to the second section 28, i.e, that one of the sections is bent 90 degrees, such as shown in FIG. 4. The bending is schematically illustrated by the arrow C. It should be understood that the board may be bent in the direction opposite the arrow C. The allows the circuit board 10 to have both a horizontal main board and a vertical user interface board which are in both physical contact with one another as well as electrical communication.

In any of the embodiments, the amount that either the first section 26 or the second section 28 can be bent may vary from greater than zero degrees to less than 180 degrees. If more than one channel 16 is formed in the board 10 then the bending process is repeated at each channel. In the case of circuit boards 10 with more than one conducting layer, holes can be drilled in the layer and used to shift all conducting traces 16 to one side in the area where the channel will be cut, such that the traces 16 will not be damaged.

Alternatively, after the circuit board 10 is assembled, it can be bent by both forming a channel 18 in the board 10 and by localized heating of the circuit board 10 at the channel 18. The combination of the two methods allows the depth of the channel to be shallower and also allows for a lower temperature to be used to heat the circuit board 10. The temperature and depth of the channel 18 can be balanced to match the application and characteristics of the supporting material from which the circuit board 10 is constructed.

Applications for the method and apparatus of the present invention include: (a) a horizontal main board with a vertical display/control board for use in vehicle audio products; (b) a horizontal main board with a vertical section for components attached to a vertical heat sink; (c) a horizontal main board with a vertical section for mounting of connectors; and (d) a vertical main board with a horizontal display/control board for use in connection with portable communication products, including hand-held and belt-clip products.

The present invention may be embodied in other specific forms without departing from the spirit or essential attributes thereof; therefore, the illustrated embodiments should be considered in all respects as illustrative and not restrictive, reference being made to the appended claims rather than to the foregoing description to indicate the scope of the invention.

What is claimed is:

1. A circuit board assembly, comprising:
    a component assembly formed on said circuit board;
    a first portion of said circuit board lying in a predetermined plane;
    a second portion of said circuit board formed integral with said first portion of said circuit board and lying in a separate plane from said first portion, said second portion of said circuit board diverging from said first portion at a juncture; and
    a channel formed in said circuit board at said juncture between said first portion of said circuit board and said second portion of said circuit board.

2. The assembly of claim 1, wherein said second portion of said circuit board is perpendicular to said first portion of said circuit board.

3. The assembly of claim 2, wherein said circuit board assembly is for use in connection with vehicle audio products and said first portion is a horizontal main board and said second portion is a vertical display/control board.

4. The assembly of claim 2, wherein said circuit board assembly is for use in connection with portable communications products and said first portion is a vertical main board and said second portion is a horizontal display/control board.

5. The assembly of claim 2, wherein said channel is formed by routing.

6. The assembly of claim 2, wherein said channel is formed by sawing.

7. A circuit board, having a component assembly thereon, and including a first portion and a second portion, comprising:
    said first portion of said circuit board having a first longitudinal end, said first portion of said circuit board lying in a predetermined plane and said first longitudinal end lying in said same plane as said first portion;
    said second portion of said circuit board having a second longitudinal end, said second portion of said circuit board lying in a predetermined plane, and said second longitudinal end lying in said same plane as said second portion;
    a channel formed in said circuit board separating said first portion of said circuit board from said second portion of said circuit board, said channel being formed such that a third portion of said circuit board remains below said channel connecting said first portion of said circuit board to said second portion of said circuit board;
    wherein said circuit board is bent at said third portion such that said predetermined plane for said first portion of said circuit board is different from said predetermined plane for said second portion of said circuit board.

8. The circuit board as recited in claim 7, wherein said predetermined plane of said first portion lies generally perpendicular to said predetermined plane of said second portion.

9. The circuit board as recited in claim 7, wherein said circuit board is incorporated into a vehicle audio product.

10. The circuit board as recited in claim 7, wherein said circuit board is incorporated into a portable communications product.

11. The circuit board as recited in claim 7, wherein said component assembly has a plurality of conducting traces formed on said first surface and a plurality of conducting traces formed on said second surface.

12. The circuit board as recited in claim 11, further comprising at least one connecting lead which electrically connects said plurality of conducting traces on said first surface with said plurality of conducting traces on said second surface.

* * * * *